United States Patent [19]

Iwamura et al.

[11] Patent Number: 5,583,814
[45] Date of Patent: Dec. 10, 1996

[54] SEMICONDUCTOR MEMORY DEVICE, CHAIN MEMORY DEVICE, AND DATA PROCESSING APPARATUS

[75] Inventors: Masahiro Iwamura, Hitachi; Yutaka Kobayashi, Katsuta; Kei Kato, Tokyo, all of Japan

[73] Assignee: Hitachi, Ltd., Tokyo, Japan

[21] Appl. No.: 260,361

[22] Filed: Jun. 14, 1994

[30] Foreign Application Priority Data

Jul. 6, 1993 [JP] Japan .................................. 5-167003

[51] Int. Cl.⁶ .................................................. G11C 7/00
[52] U.S. Cl. ................................ 365/189.05; 365/189.01
[58] Field of Search ........................ 355/189.05, 189.01, 355/230.03; 307/279, 530, 473

[56] References Cited

U.S. PATENT DOCUMENTS

| | | | |
|---|---|---|---|
| 4,701,889 | 10/1987 | Ando | 365/189.05 X |
| 4,894,803 | 1/1990 | Aizaki | 365/189.05 |
| 5,239,506 | 8/1993 | Dachtera et al. | 365/189.05 |
| 5,307,319 | 4/1994 | Kohketsu et al. | 365/189.05 X |
| 5,311,471 | 5/1994 | Matsumoto et al. | 365/189.05 |

Primary Examiner—Son T. Dinh
Attorney, Agent, or Firm—Antonelli, Terry, Stout & Kraus

[57] ABSTRACT

An arrangement is provided for the input level of an output buffer from fluctuating when a memory device goes from an active state to an inactive state. To achieve this, a level holding circuit is provided at a point connecting an output of a sense circuit for amplifying a signal read from a memory array to an input of an output buffer. The level holding circuit is constituted so that, when the sense circuit goes from an active state to an inactive state, the level holding circuit holds an input level of the output buffer at a time immediately before the sense circuit goes inactive.

20 Claims, 8 Drawing Sheets

5,583,814

SEMICONDUCTOR MEMORY DEVICE, CHAIN MEMORY DEVICE, AND DATA PROCESSING APPARATUS

BACKGROUND OF THE INVENTION

The present invention relates to a semiconductor memory device and an apparatus to which the semiconductor memory device is applied. More particularly, the present invention relates to a semiconductor memory device that consumes less power, generates less noise, and provides a novel reading capability, as well as to an apparatus to which this semiconductor memory device is applied.

There is known a memory device having an address buffer, a row decoder, a column decoder, a column selector, a memory array, a read/write controller, a sense circuit, and an output buffer. An address signal is applied to the row decoder and the column decoder from the address buffer. A chip select signal is provided to the row decoder, the column decoder, and the read/write controller. When a specified memory cell in the memory array is selected based on the address signal and the chip select signal, a read signal coming from the memory cell is amplified by the sense circuit to be supplied to a load via the output buffer. In the above-mentioned memory circuit, the sense circuit is put in an inactive state after data has been read, thereby reducing the power consumption.

A problem with the conventional memory device is that, when the sense circuit goes from the active state to the inactive state, valid data can be read from the output buffer until a certain time elapses; but after this time has elapsed, the data read from the output buffer becomes invalid. That is, a variation in electric charge charged to a parasitic capacitance present in a circuit connecting the sense circuit and the output buffer makes an output level of the sense circuit be intermediate between a power supply potential and a reference potential. This may cause the output buffer to operate abnormally when the sense circuit is put in the inactive state, thereby causing a rush current to flow through the output buffer.

To solve the above-mentioned problem, an apparatus is proposed as disclosed in Japanese Patent Laid-open No. 4-82089, in which a circuit is provided to forcibly and fixedly set the output buffer level to a high level when the sense circuit goes into the inactive state. The proposed circuit setup can prevent the output level of the sense circuit from becoming the intermediate level, which in turn can prevent the abnormal current from flowing through the output buffer.

However, with the conventional technique, the output level of the output buffer is forcibly and fixedly set to the high level when the sense circuit goes from of the active state to the inactive state, so that a switching operation is required for fixing the output level to the high level. This switching operation may cause a power supply noise or a ground noise, thereby making the circuit operate erroneously. In addition, using the circuit having the above-mentioned setup for a memory device for multi-bit parallel output increases the power consumption due to the above-mentioned switching.

Further, with the conventional memory device, a read data valid time is assured only for a period as short as less than several nanoseconds when the memory device is put in a deselected state, so that there is a problem of restricting the availability of memory device utilizing techniques or the range of memory device applications.

SUMMARY OF THE INVENTION

It is therefore an object of the present invention to provide a semiconductor memory device that suppresses a variation in an input level of the output buffer when the memory device goes from the active state into the inactive state and an apparatus to which the semiconductor memory device is applied.

Another object of the present invention is to provide a semiconductor memory device having a novel memory reading capability and an apparatus to which the semiconductor memory device is applied.

According to one aspect of the present invention, there is provided a semiconductor memory device comprising a memory array arranged with a plurality of memory cells, memory cell selecting means for selecting a specified memory cell in the memory array based on an address signal, a sense circuit for amplifying a signal read from the specified memory cell selected by the memory cell selecting means, an output buffer for driving a load in response to a signal coming from the sense circuit, sense circuit control means for putting the sense circuit in an active state in response to one level of a memory select instructing signal and putting the sense circuit in an inactive state in response to another level of the memory select instructing signal, and level holding means for holding an input level of the output buffer at a time immediately before the sense circuit is put in the inactive state in response to a memory deselecting signal.

According to a second aspect of the present invention, there is provided a second semiconductor memory device wherein a three-state output buffer is used in place of the output buffer used in the semiconductor memory device according to the first aspect of the invention. The three-state buffer drives a load in response to the signal coming from the sense circuit when an output enable signal is provided.

According to a third aspect of the present invention, there is provided a third semiconductor memory device comprising a first logic gate for outputting a first gate signal based on a logical product between the memory select instructing signal and a first enable signal; a second logic gate for outputting a second output enable signal in response to a second enable signal or the first gate signal coming from the first logic gate, both the gates being provided on the semiconductor memory device according to the first aspect of the invention; a three-state output buffer for driving a load in response to a signal coming from a sense circuit upon input of the second gate signal, in place of the output buffer provided on the semiconductor memory device according to the first aspect of the invention; and level holding means for holding an input level of the three-state output buffer at a time immediately before the sense circuit is put in the inactive state in response to the memory select instructing signal, in place of the level holding means provided on the semiconductor memory device according to the first aspect of the invention.

According to a fourth aspect of the present invention, there is provided, in combination of features of the above-mentioned semiconductor memory devices, a chained memory device, wherein each of the plurality of semiconductor memory devices is connected in series via an address signal line, an output signal of an output buffer of an uppermost semiconductor memory device is supplied to a lowermost semiconductor memory device as an address signal, and an independent memory select instructing signal is applied to each of the connected semiconductor memory device.

According to a fifth aspect of the present invention, there is provided a first data processing apparatus comprising a plurality of semiconductor memory devices having different read access times and a data processing circuit for independently outputting a memory select instructing signal and an address signal to each of the plurality of the semiconductor memory devices and independently capturing data from each of the plurality of semiconductor memory devices for processing, wherein each of the plurality of semiconductor memory devices is composed of one of the above-mentioned semiconductor memory devices according to the first, second, and third aspects of the invention.

According to a sixth aspect of the present invention, there is provided a second data processing apparatus comprising a plurality of semiconductor memory devices and a data processing circuit commonly connected to each of the plurality of semiconductor memory devices via an address bus and a data bus common to a plurality of memory select signal lines and independently connected to each of the plurality of semiconductor memory devices via an output enable signal line in order to transfer data with each of the plurality of semiconductor memory devices for processing via the data bus, wherein each of the plurality of semiconductor memory devices is composed of one of the semiconductor memory devices according to the second and third aspect of the invention.

According to a seventh aspect of the present invention, there is provided a data reading circuit comprising a sense circuit for amplifying a signal read from a memory cell, an output buffer for driving a load in response to a signal outputted from the sense circuit, and a latch for holding an input level of the output buffer at a time immediately before the sense circuit is deactivated in response to a signal for switching the sense signal from active state to inactive state.

According to an eighth aspect of the present invention, there is provided a data reading circuit comprising a sense circuit for amplifying a signal read from a memory cell, an output buffer for driving a load in response to a signal outputted from the sense circuit, and a three-state inverter connected to the output buffer in reverse parallel for inverting an input signal for output in response to a signal for switching the sense circuit from active state to inactive state, wherein the output buffer and the three-state inverter constitute a latch for holding an input level of the output buffer at a time immediately before the sense circuit is deactivated.

In operation, a specified memory cell is selected from among the memory cells of the memory array in response to one level of the memory select instructing signal. When the selected memory is deselected in response to the other level of the memory select instructing signal, the sense circuit is deactivated. An input level of the output buffer immediately before the sense circuit is held by the level holding means. This state is kept until the memory select instructing signal comes a second time. That is, the output buffer can keep outputting final read data even after the memory is deselected.

In this case, if, for the above-mentioned output buffer, an output buffer of a type is used that drives a load in response to the output signal of the sense circuit with the condition of input of the output enable signal, last read data can be fetched by using the output enable signal at any time even after the memory has been put out of selected state into deselected state.

If, for the above-mentioned output buffer, an output buffer of a type is used that drives a load in response to the output signal of the sense circuit with the condition of output of the second gate signal, final read data can be fetched with the condition of a logical product between the memory select instructing signal and the first output enable signal and the final read data can be fetched by using the second output enable signal at any time even after the memory has been put out of selected state into deselected state.

BRIEF DESCRIPTION OF THE DRAWINGS

These and other objects, features and advantages of the present invention will be understood more clearly from the following detialed description with reference to the accompanying drawings, wherein.

DESCRIPTION OF THE PREFERRED EMBODIMENT

First, one preferred embodiment of the present invention will be described with reference to the accompanying drawings.

Figure 1:
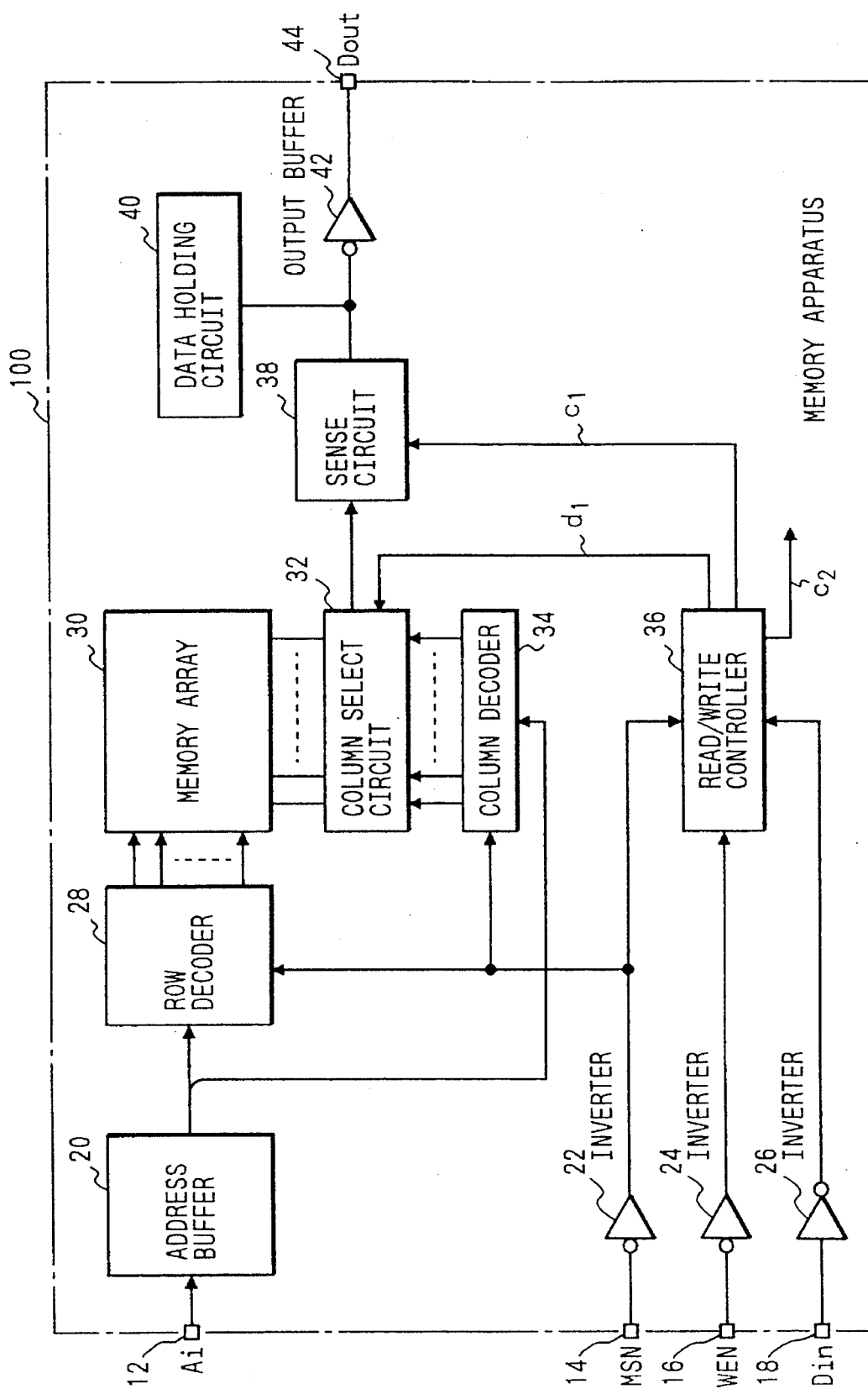
FIG. 1 is a block diagram illustrating the memory device practiced as one preferred embodiment of the invention.

Referring to FIG. 1, there is shown a diagram illustrating a constitution of the memory device practiced as one embodiment of the invention. As the semiconductor memory device, a memory device 100 comprises an address buffer 20, inverters 22, 24, and 26, a row decoder 28, a memory array 30, a column select circuit 32, a column decoder 34, a read/write controller 36, a sense circuit 38, a level holding circuit 40, and an output buffer 42. The address buffer 20 is connected to an input terminal 12, the inverters 22, 24, and 26 to input terminals 14, 16, and 18 respectively, and the output buffer 42 to an output terminal 44.

The input terminal 12 is applied with an address signal Ai. The address signal Ai is supplied to the row decoder 28 and the column decoder 34 via the address buffer 20. The input terminal 14 is applied with a memory select signal MSN. The memory select signal MSN, when low, is inverted by the inverter 22 as a memory select instructing signal; when high, the MSN signal is inverted by the inverter 22 as a memory deselect instructing signal. The inverted signal is supplied to the row decoder 28, the column decoder 34, and the read/write controller 36. The input terminal 16 is applied with a write enable signal WEN. The input terminal 18 is applied with a write data signal Din. These signal are inverted by the inverters 24 and 26 respectively to be supplied to the read/write controller 36.

The read/write controller 36 generates a write data signal d1 based on the input signal and generates control signals c1 and c2. The controller supplies the write data signal d1 to the column select circuit 32, the control signal c1 to the sense circuit 38, and the control signal c2 to the level holding circuit 40. The control signals c1 and c2 are generated as complementary signals: when the control signal c1 goes high, the sense circuit 38 is activated (operable); when it goes low, the sense circuit 38 is deactivated (inoperable). That is, the read/write controller 36 is constituted as a sense circuit control means.

The memory array 30 is composed of a matrix of a plurality of memory cells. When the address signal Ai and the memory select signal MSN are entered in the row decoder 28 and the column decoder 34, a memory cell specified by the address signal Ai is selected from the memory array 30 in response to the memory select instructing signal. A signal read from the selected memory cell is sent to the sense circuit 38. That is, the address buffer 20, the row decoder 28, the column select circuit 32, and the column decoder 34 are constituted as memory cell selecting means.

The sense circuit, when activated by the control signal c1, amplifies a signal read from the column select circuit 32 and sends the amplified signal to the output buffer 42. The output buffer 42 is constituted as an inverter to output via the output terminal 44 a signal for driving the load in response to the signal coming from the sense circuit 38. The level holding circuit 40 holds, in response to the control signal c2, an input level of the output buffer 42 immediately before the sense circuit 38 is put out of its active state into a deactivated state.

Figure 2:
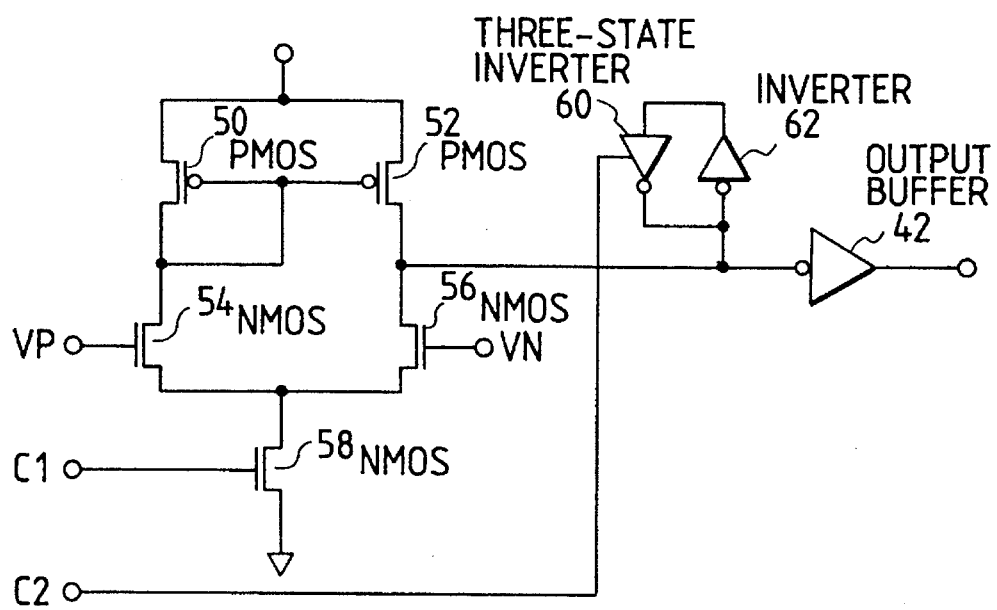
FIG. 2 is a circuit block diagram illustrating the data reading circuit practiced as one preferred embodiment of the invention.

Actually, as shown in FIG. 2, the sense circuit 38 is composed of a differential amplifier of current mirror type comprising PMOS transistors 50 and 52 and NMOS transistors 54, 56, and 58. The level holding circuit 40 is composed of a three-state inverter 60 and an inverter 62. Gate terminals of the NMOS transistors 54 and 56 are connected to the column select circuit 32. A gate of the NMOS transistor 58 is connected to the read/write controller 36. When the control signal c1 is high, the transistor 58 is turned on to output the signal of the column select circuit 32 to the output buffer 42.

The three-state inverter 60 constitutes a latch along with the inverter 62. When the control signal c2 is low, or the sense circuit is activated, this latch is in a high impedance state and therefore disabled as a latch. When the control signal c2 goes from low to high, the three-state inverter 60 functions as a latch, thereby latching the input level of the output buffer 42 at a time immediately before the sense circuit is deactivated.

Figure 3:
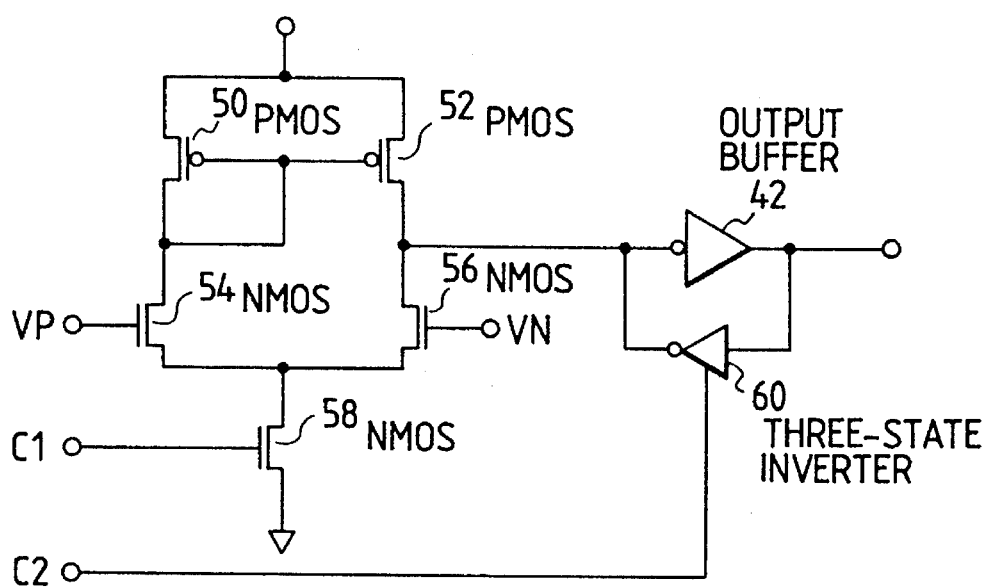
FIG. 3 is a circuit block diagram illustrating the data reading circuit practiced as another preferred embodiment of the invention.

Instead of the data reading circuit of FIG. 2, a circuit can be used in which the output and the input of the three-state inverter 60 are connected to the input and the output of the output buffer 42 as shown in FIG. 3. In the circuit of FIG. 3, the three-state inverter 60 is also in the high impedance state when the control signal c2 is low. When the control signal c2 goes high, the three-state inverter 60 functions as an inverter. The three-state inverter 60 constitutes a latch along with the output buffer 42. This latch holds the input level of the output buffer 42 at a time immediately before the sense circuit 38 is deactivated.

Thus, according to the above-mentioned embodiment, use of the circuit shown in FIG. 2 or 3 for example as a data reading circuit comprising the sense circuit 38, a level holding circuit 40, and an output buffer 42 allows the level holding circuit 40 to hold the input level of the output buffer 42 at a time immediately before the sense circuit 38 is deactivated when the memory device 10 is put out of selected stated into deselected state. Since the level held by the level holding circuit is not intermediate between a power potential and a reference potential, it prevents the output buffer 42 from operating abnormally and a rush current from flowing through the output buffer 42. Moreover, since no level change occurs before or after the memory device 10 is put out of selected state into deselected state, the output buffer 42 does not cause a switching operation, thereby preventing the power consumption from increasing.

In the above-mentioned embodiment, when the memory device 10 is in the deselected state, the memory select signal MSN prevents the row decoder 28 and the column decoder 34 from operating, thereby reducing the power consumption.

Figure 4:
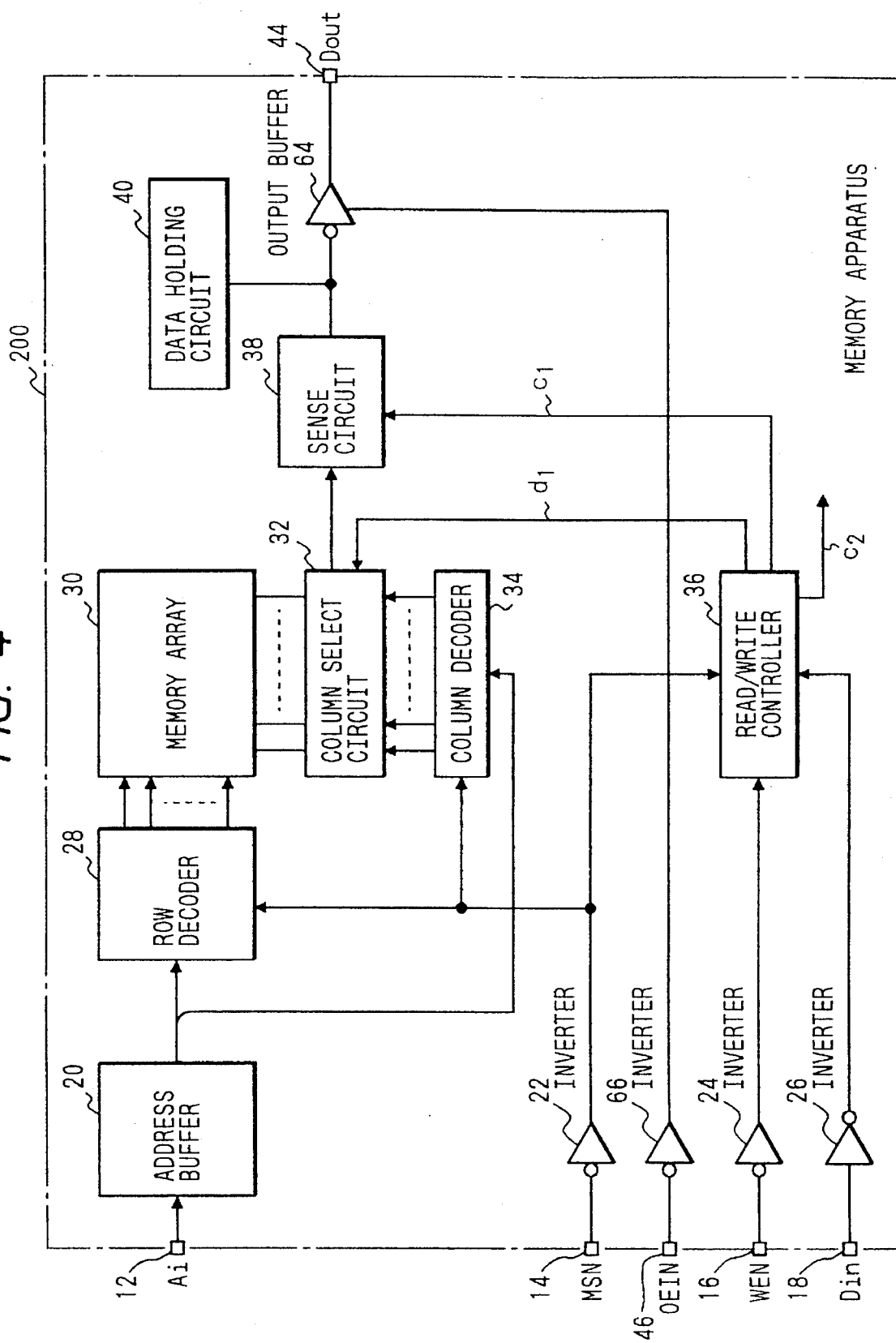
FIG. 4 is a block diagram illustrating the memory device practiced as another preferred embodiment of the invention.

Next, a memory device practiced as a second preferred embodiment of the invention will be described with reference to FIG. 4.

In the second preferred embodiment, a three-state buffer 64 is provided instead of the output buffer of FIG. 1. An output of an inverter 66 is connected to a gate of the three-state buffer 64. An output enable signal OEN is applied to the inverter 66 via an input terminal 46. The three-state output buffer 64 is in high impedance state when an output level of the inverter 66 is low. When the output level of the inverter 66 goes high, the three-state output buffer 64 functions as a buffer and outputs a signal coming received from a sense circuit 38 to an output terminal 44.

According to the above-mentioned second embodiment, the three-state output buffer 64 can be directly driven by the output enable signal OEN regardless of the state of the memory select signal MSN, so that, even after the memory device 200 (corresponding to the memory device 100 of FIG. 1) is put in a deselected state, final read data can be fetched at any time.

Figure 5:
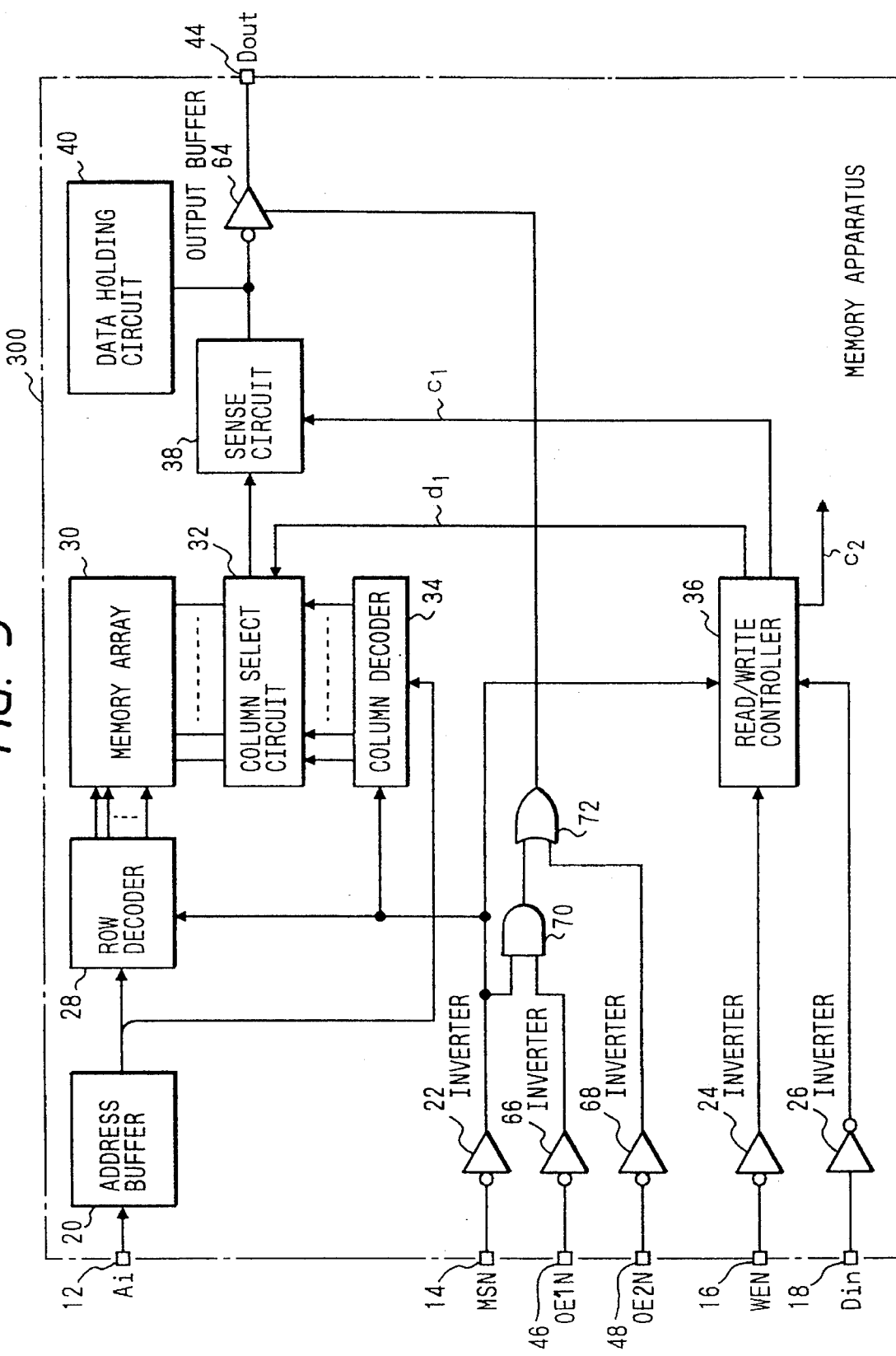
FIG. 5 is a block diagram illustrating the memory device practiced as still another preferred embodiment of the invention.

The memory device practiced as a third preferred embodiment of the invention will be described with reference to FIG. 5.

In the third preferred embodiment, a three-state output buffer 64 is provided instead of the output buffer 42 of the memory device 100 of FIG. 1. In addition, this embodiment is provided with inverters 66, 68, an AND gate 70, and an OR gate 72. An output signal of the OR gate 72 controls the three-state output buffer 64. The inverters 66 and 68 are connected to input terminals 46 and 48, respectively. A first output enable signal OE1N is applied to the input terminal 46. A second output enable signal OE2 is applied to the input terminal 48. Signals of the inverters 22 and 66 are applied to the AND gate 70. When the signals applied to the AND gate 70 both go high, the AND gate 70 outputs a first gate signal to the OR gate 72. The second output enable signal OE2N is applied to the OR gate 72 via the inverter 68. The OR gate 72 outputs a high second gate signal when a high level signal is outputted from the AND gate 70 or a high level signal is outputted from the inverter 68. When the second gate signal goes high, the three-state output buffer 64 functions as an inverter and outputs a signal coming from an sense circuit 38 to an output terminal 44. It should be noted that, when the second gate signal is low, the three-state output buffer 64 is put in high impedance state.

Thus, according to the third preferred embodiment, when a memory device 300 is put in the selected state by a memory select signal MSN, read data can be outputted by the first output enable signal OE1N. Even after the memory device 300 is put in the deselected state, the read data can be outputted by the second output enable signal OE2N at any time. Consequently, the memory device 300 practiced as the third preferred embodiment provides higher applicability than that provided by the memory devices of the first and second embodiments.

Figure 6:
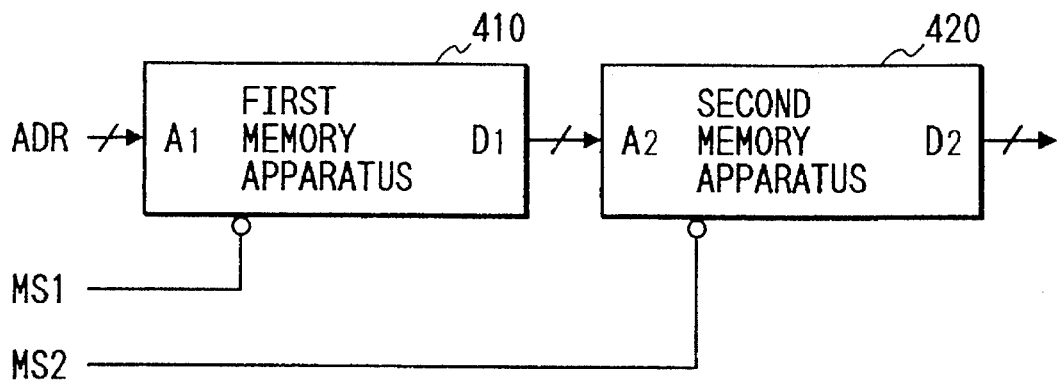
FIG. 6 is a block diagram illustrating a chain memory device.
Figure 7:
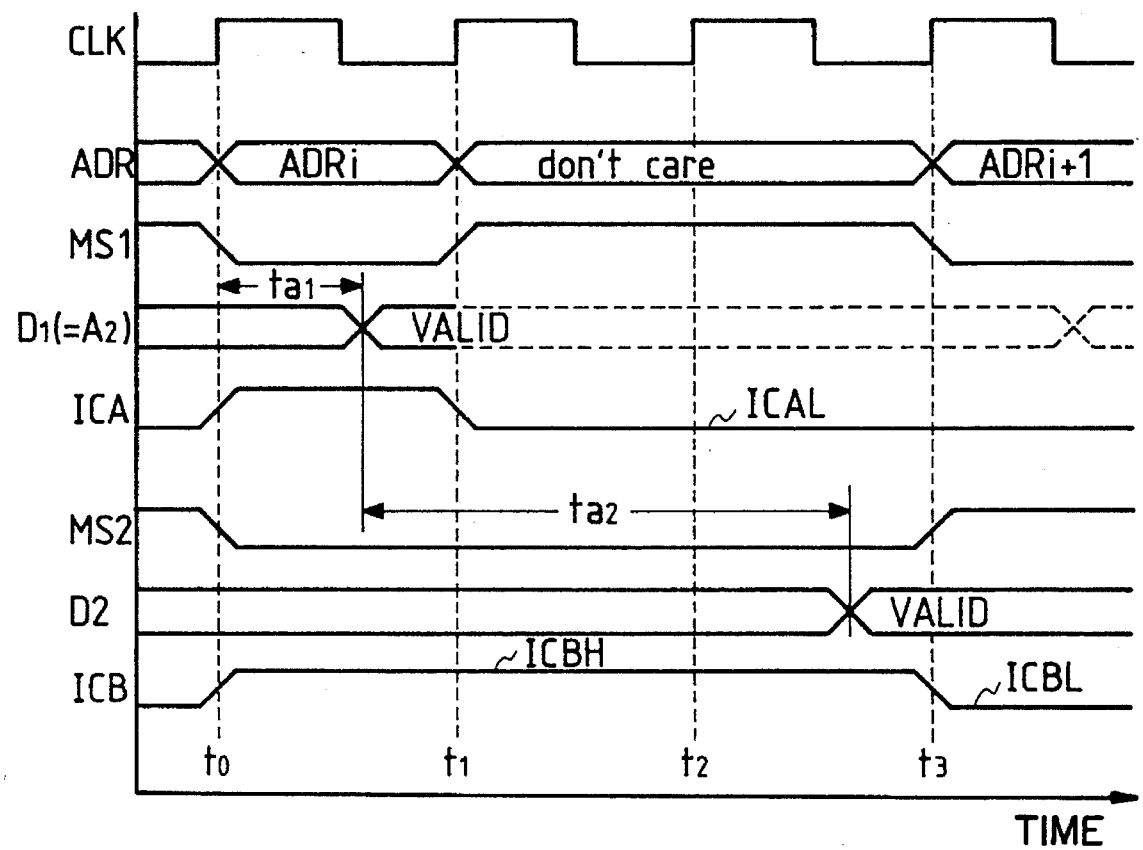
FIG. 7 is a timing chart for describing an operation of the chain memory device of FIG. 6.

Next, a chain memory device practiced as one preferred embodiment of the invention will be described with reference to FIG. 6. Referring to FIG. 6, the chain memory device comprises a first memory device 410 and a second memory device 420 which are connected to each other in series via an address signal line. These memory devices 410 and 420 are each composed of the memory device 100, 200 or 300 of FIG. 1, 4 or 5, respectively. The memory device 410 is constituted as an upper memory, while the memory device 420 is constituted as a lower memory. An address signal ADR and a memory select signal MS1 are applied to an input terminal of the memory device 410. An output of the memory device 410 is connected to an address input terminal of memory device 420. A memory select signal MS2 is applied to an input terminal of the memory device 420. A read signal is outputted from an output terminal D2 of the memory device 420.

In the chain memory device constituted as mentioned above, the memory devices 410 and 420 are driven in synchronization with a system clock CLK. When the address signal ADR and the memory select signal MS1 are entered in the memory device 410 at time t0, valid data D1 is read after time ta1 to be outputted to an address terminal A2 of the memory device 420. The memory select signal MS1 is cleared at time t1 but, unless a next address access occurs, the data D1 is held as final read data. That is, the data D1 is held by a level holding circuit 40 in the memory device 410. When the valid data D1 has been read, valid data D2 is read by the memory device 420 after time t2. The valid data D2 is also held by the level holding circuit 40 in the memory device 420 if the reading operation is cleared after time t3.

Since a memory select signal MS2 is kept selected during a period t0 through t3 when sequentially reading data from the memory devices 410 and 420, an operating current ICB keeps flowing into the memory device 410 during this period. However, since the memory select signal MS1 is kept selected for only a period t0 to t1, an operating current ICA flows into the memory device 410 for only the same period. That is, making the operating current ICA flow into the memory device 410 for the period t0 to t1 establishes an output data of the memory device 410, so that the operating current ICA need not be made to flow for the period t1 through t3, thereby reducing the power consumption.

According to the above-mentioned embodiment, the output data of the memory device 410 is held even in the deselected state, so that there is no need for providing a special circuit such as a latch between the memory device 410 and the memory device 420, thereby shortening a time for outputting read data D2 via an address signal ADR2.

Figure 8:
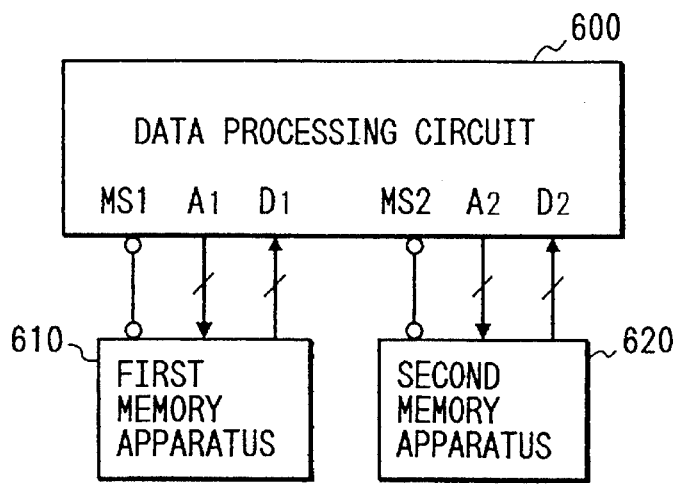
FIG. 8 is a block diagram illustrating the data processing apparatus practiced as one preferred embodiment of the invention.

Now, a data processing apparatus practiced as one preferred embodiment of the invention will be described with reference to FIG. 8.

This embodiment comprises a data processing circuit 600, a first memory device 610, and a second memory device 620. The memory devices 610 and 620 are connected to the data processing circuit 600 via separate interface circuits. That is, each of the memory devices is connected to the data processing circuit 600 via an address signal line, a memory select signal line, and a data signal line. Each of the memory devices 610 and 620 is composed of the memory device 100, 200 or 300 of FIG. 1, 4 or 5 for example. In this embodiment, the memory device 610 is used for low-speed memory, while the memory device 620 is used for high-speed memory.

Figure 9:
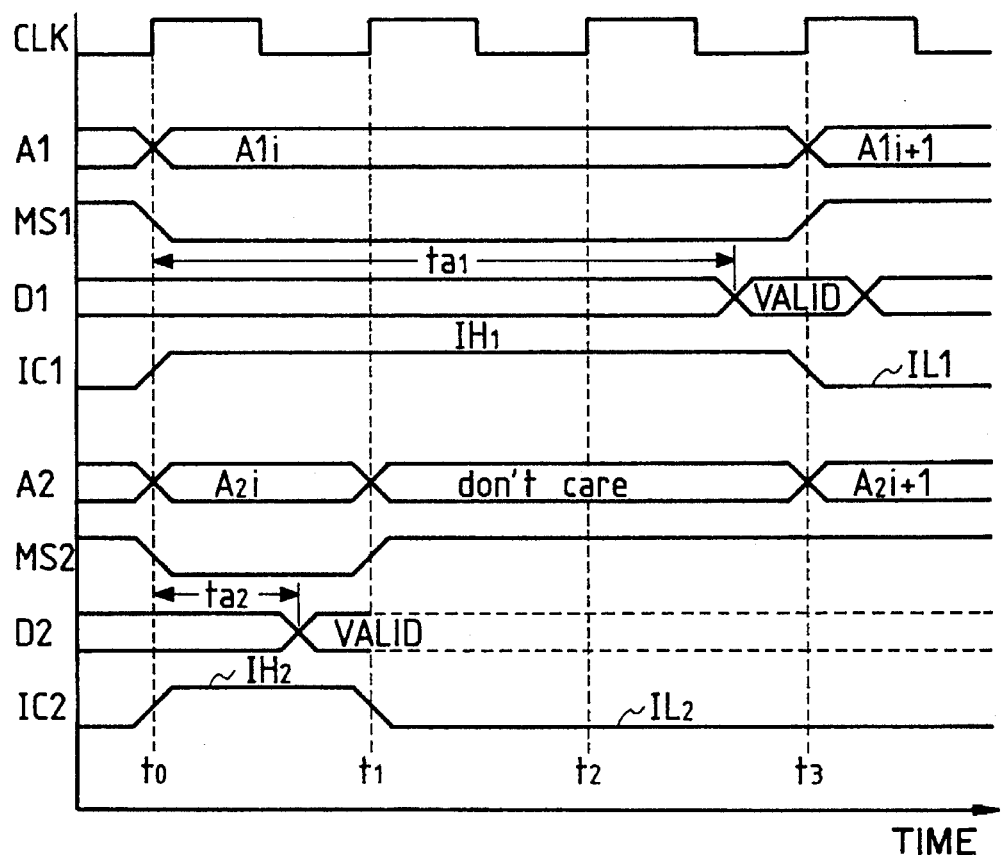
FIG. 9 is a timing chart for describing an operation of the data processing apparatus of FIG. 8.

In the above-mentioned embodiment, the memory devices 610 and 620 are driven in synchronization with a system clock CLK coming from the data processing circuit 600 as shown in FIG. 9. When an address signal A1 and a memory select signal MS1 are applied to the memory device 610 during a period t0 and an address signal A2 and a memory select signal AMS2 are applied to the memory device 620, valid data D2 is read from the high-speed memory device 620 after a time ta2. On the other hand, valid data D1 is read from the low-speed memory device 610 after a time ta1. Then, the memory select signal MS2 to the memory device 620 is cleared at t1. But the read data D2 is kept held in the level holding circuit 40 as final read data unless a next address access occurs. When the valid data D1 coming from the memory device 610 is entered in the data processing circuit 600 after the read data D2 coming from the memory device 620 has been entered in the data processing circuit 600, the data processing circuit 600 performs data processing based on the entered data.

Thus, in the above-mentioned embodiment, the memory select signal MS1 is selectable for the low-speed memory device 610 during a period t0 through t3, so that it is necessary to flow an operating current IC1 for this period. For the high-speed memory device 620, the signal is selectable only for a period t0 to t1, an operating current IC2 flows only for that period. Consequently, it is unnecessary for the high-speed memory device 620 to flow the operating current IC2 for a period t1 through t3, thereby reducing the power consumption.

Also, in the above-mentioned embodiment, if the memory devices 610 and 620 are simultaneously accessed for data processing, since the data of the high-speed memory device is held, no additional circuit such as a synchronizing circuit need not be provided for canceling an access speed difference between the memory devices, thereby simplifying the constitution of the apparatuses.

Figure 10:
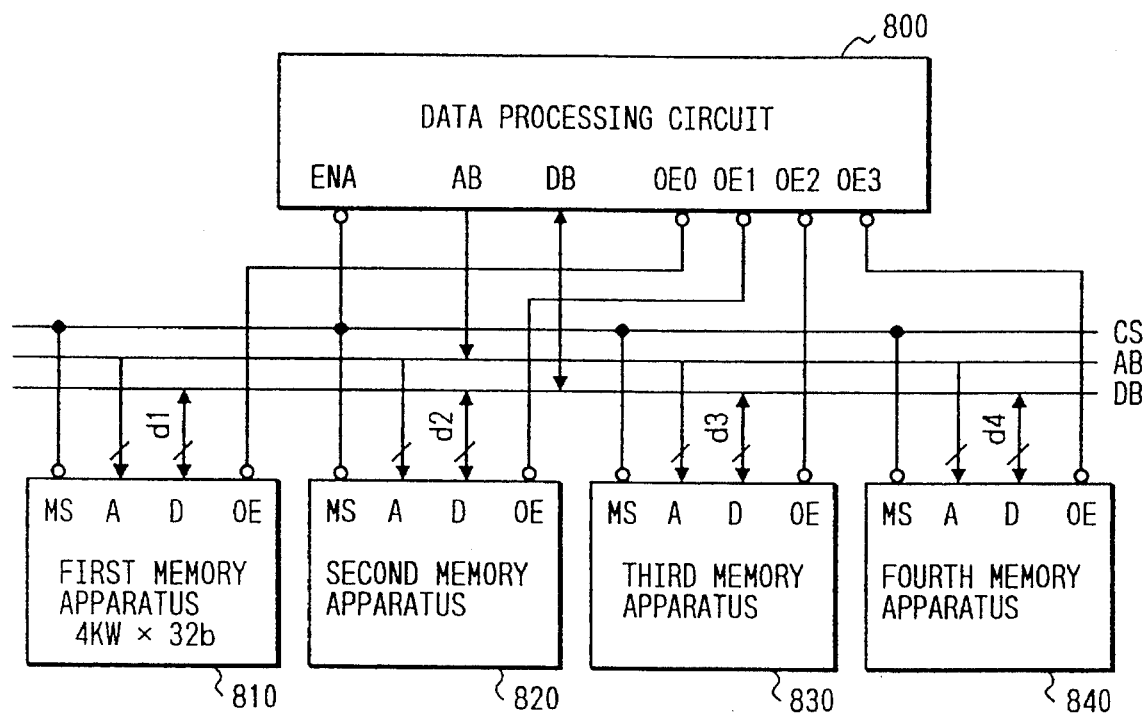
FIG. 10 is a block diagram illustrating the data processing apparatus practiced as another preferred embodiment of the invention.

Next, the data processing apparatus practiced as another embodiment of the invention will be described with reference to FIG. 10.

This embodiment comprises a data processing circuit 800, a first memory device 810, a second memory device 820, a third memory device 830, and a fourth memory device 840. Each of the memory devices 810, 820, 830, and 840 is connected to the data processing circuit 800 via a separate output enable signal line and via a common memory select signal line, a common address bus, and a common data bus. Each of the memory devices 810 through 840 is composed of the memory device 200 of FIG. 4 or the memory device 300 of FIG. 5 for example.

Figure 11:
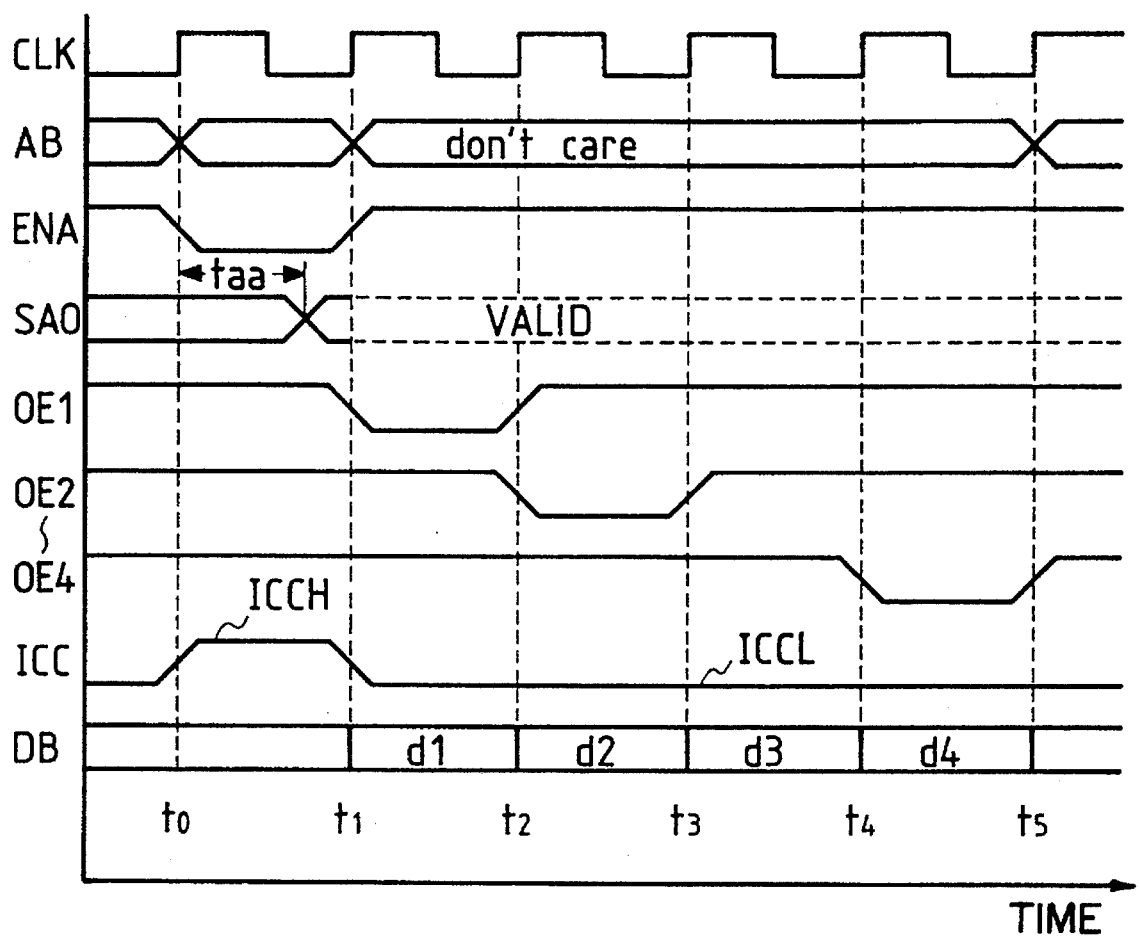
FIG. 11 is a timing chart for describing an operation of the data processing apparatus of FIG. 10.

As shown in FIG. 11, in the data processing apparatus of the above-mentioned constitution, the memory devices 810 through 840 are driven in synchronization with a system clock CLK coming from the data processing circuit 800. When an address signal AB and a memory select signal ENA are entered in the memory devices 810 through 840 at time t0, valid data SAO is outputted from the memory devices 810 through 840 after time taa. Then, when time t1 is reached, the memory select signal ENA is cleared but the output data of the memory devices 810 through 840 are kept held by the level holding circuit 40. Subsequently, during a period t1 through t5, when output enable signals OE1 through OE4 are entered in the memory devices 810 through 840 respectively, data read from the memory devices 810 through 840 are entered in the data processing circuit 800 via a data bus DB. The entered data are processed by the data processing circuit 800 and the processed data are put on the data bus DB.

Thus, in the above-mentioned embodiment, when transferring data between the data processing circuit 800 and the memory devices 810 through 840, only putting the memory select signal ENA in selected state for only a period t0 to t1 holds the data of the memory devices 810 through 840, so that an operating current ICC may only flow into the memory devices 810 through 840 for only the period t0 to t1. It is therefore unnecessary to flow the operating current ICC for a period t1 through t5, thereby reducing the power consumption.

Further, in the above-mentioned embodiment, when the data processing circuit 800 reads data from the memory devices 810 through 840, the data processing circuit may only capture the data sequentially from the memory devices according to the output enable signal, so that the number of output buffers to be driven at a time is reduced to one fourth of all, thereby significantly suppressing a switching noise that occurs on power and ground lines.

As described and according to the invention, when a memory device goes from active state to inactive state, the input level of an output buffer is prevented from fluctuating, thereby reducing the power consumption and suppressing the noise.

Further, according to the present invention, there are provided a memory device having a novel reading capability and an apparatus to which the memory device is applied.

What is claimed is:

1. A semiconductor memory device comprising:

a memory array arranged with a plurality of memory cells;

memory cell selecting means for selecting a specified memory cell in said plurality of memory cells according to an address signal;

a sense circuit for amplifying a signal read from the memory cell selected by said memory cell selecting means;

an output buffer for driving a load in response to an output signal of said sense circuit;

sense circuit control means for enabling said sense circuit in response to a first level of an external memory select instructing signal indicating that the memory device has been selected and disabling said sense circuit in response to a second level of the external memory select instructing signal indicating that the memory device has been deselected; and level holding circuit for holding an input level of said output buffer at a time immediately before said sense circuit is disabled in response to said second level of the external memory select instructing signal for deselecting the memory device.

2. A semiconductor memory device comprising:

a memory array arranged with a plurality of memory cells;

memory cell selecting means for selecting a specified cell in said memory array according to an address signal;

a sense circuit for amplifying a signal read from the memory cell selected by said memory cell selecting means;

a three-state output buffer for driving a load in response to an output signal of said sense circuit if an output enable signal is entered;

a sense circuit control means for enabling said sense circuit in response to a first level of an external memory select instructing signal indicating that the memory device has been selected and disabling said sense circuit in response to a second level of the external memory select instructing signal indicating that the memory device has been deselected; and a level holding circuit for holding an input level of said three-state output buffer at a time immediately before said sense circuit is disabled in response to said second level of the external memory select instructing signal for deselecting the memory device.

3. A semiconductor memory device comprising:

a memory array arranged with a plurality of memory cells;

memory cell selecting means for selecting a specified memory cell in said memory array according to an address signal;

a sense circuit for amplifying a signal read from the memory cell selected by said memory cell selecting means;

sense circuit control means for enabling said sense circuit in response to one level of a memory select instructing signal and disabling said sense circuit in response to the other level of the memory select instructing signal;

a first logic gate for outputting a first gate signal with a logical product between said memory select instructing signal and a first output enable signal;

a second logic gate for outputting a second gate signal in response to a second output enable signal or said first gate signal coming from said first logic gate;

a three-state output buffer for driving a load in response to an output signal of said sense circuit if said second gate signal is entered; and level holding means for holding an input level of said three-state output buffer at a time immediately before said sense circuit is disabled in response to the other level of the memory select instructing signal.

4. A chain memory device having a plurality of semiconductor memory devices, each of said plurality of semiconductor memory devices comprising:

a memory array arranged with a plurality of memory cells;

memory cell selecting means for selecting a specified memory cell in said memory array according to an address signal;

a sense circuit for amplifying a signal read from the memory cell selected by said memory cell selecting means;

an output buffer for driving a load in response to an output signal of said sense circuit;

sense circuit control means for enabling said sense circuit in response to a first level of a memory select instructing signal indicating that the memory device has been selected and disabling said sense circuit in response to a second level of the memory select instructing signal indicating that the memory device has been deselected; and level holding means for holding an input level of said output buffer at a time immediately before said sense circuit is disabled in response to the second level of the external memory select instructing signal for deselecting the memory device;

wherein said plurality of semiconductor memory devices are connected to each other in series via an address signal line, and wherein an output signal of said output buffer of an uppermost semiconductor memory device is inputted to a lowermost semiconductor memory device as said address signal and said memory select instructing signal is separately entered in each of said plurality of semiconductor memory devices.

5. A chain memory device having a plurality of semiconductor memory devices, each of said plurality of semiconductor memory devices comprising:

a memory array arranged with a plurality of memory cells;

memory cell selecting means for selecting a specified memory cell in said memory array according to an address signal;

a sense circuit for amplifying a signal read from the memory cell selected by said memory cell selecting means;

a three-state output buffer for driving a load in response to an output signal of said sense circuit if an output enable signal is entered;

sense circuit control means for enabling said sense circuit in response to a first level of an external memory select instructing signal and disabling said sense circuit in response to a second level of the external memory select instructing signal; and level holding means for holding an input level of said three-state output buffer at a time immediately before said sense circuit is disabled in response to the second level of the external memory select instructing signal;

wherein said plurality of semiconductor memory devices are connected to each other in series via an address signal line, and wherein an output signal of said output buffer of an uppermost semiconductor memory device is inputted to a lowermost semiconductor memory device as said address signal and said external memory select instructing signal is separately entered in each of said plurality of semiconductor memory devices.

6. A chain memory device having a plurality of semiconductor memory devices, each of said plurality of semiconductor memory devices comprising:

a memory array arranged with a plurality of memory cells;

memory cell selecting means for selecting a specified memory cell in said memory array according to an address signal;

a sense circuit for amplifying a signal read from the memory cell selected by said memory cell selecting means;

sense circuit control means for enabling said sense circuit in response to one level of a memory select instructing signal and disabling said sense circuit in response to the other level of the memory select instructing signal;

a first logic gate for outputting a first gate signal with a logical product between said memory select instructing signal and a first output enable signal;

a second logic gate for outputting a second gate signal in response to a second output enable signal or said first gate signal coming from said first logic gate;

a three-state output buffer for driving a load in response to an output signal of said sense circuit if said second gate signal is entered; and level holding means for holding an input level of said three-state output buffer at a time immediately before said sense circuit is disabled in response to the other level of the memory select instructing signal;

wherein said plurality of semiconductor memory devices are connected to each other in series via an address signal line and an output signal of said output buffer of an uppermost semiconductor memory device is inputted to a lowermost semiconductor memory device as said address signal and said memory select instructing signal is separately entered in each of said plurality of semiconductor memory devices.

7. A data processing apparatus comprising:

a plurality of semiconductor memory devices having different read access times; and a data processing circuit for independently outputting a memory select instructing signal and an address signal to be applied as external signals to each of said plurality of semiconductor memory devices and independently capturing data from each of said plurality of semiconductor memory devices for processing;

wherein each of said plurality of semiconductor memory devices is comprised of a semiconductor memory device defined in claim 1, 2 or 3.

8. A data processing apparatus comprising:

a plurality of semiconductor memory devices; and a data processing circuit commonly connected to each of said plurality of semiconductor memory devices via a memory select signal line, an address bus, and a data bus and independently connected to each of said plurality of semiconductor memory devices via an output enable signal line in order to transfer data with each of said plurality of semiconductor memory devices via said data bus;

wherein each of said plurality of semiconductor memory devices is comprised of a semiconductor memory devices defined in claim 2 or 3.

9. A data reading circuit comprising:

a sense circuit for amplifying a signal read from a memory cell included in a memory cell array in a memory device, said sense circuit being enabled or disabled according to an external memory select instructing signal for selecting or deselecting said memory device;

an output buffer for driving a load in response to an output signal of said sense circuit; and a latch for holding an input level of said output buffer at a time immediately before said sense circuit is disabled in response to said external memory select instructing signal.

10. A data reading circuit comprising:

a sense circuit for amplifying a signal read from a memory cell included in a memory cell array in a memory device, said sense circuit being enabled or disabled according to an external memory select instructing signal for selecting or deselecting said memory device;

a three-state inverter connected to said output buffer in a reverse parallel manner for inverting an input signal and outputting the inverted signal in response to said external memory select instructing signal;

wherein said output buffer and said three-state inverter form a latch that holds an input level of said output buffer at a time immediately before said sense circuit is disabled.

11. A semiconductor memory device according to claim 1, wherein said sense circuit control means comprises a read/ write controller coupled to said sense circuit and to said level holding circuit, wherein said read/write controller further includes means for providing a level holding control signal to said level holding circuit, wherein said level holding control signal has a first level for disabling the level holding circuit when the first level of the external memory select instructing signal indicates that said memory device has been selected, and wherein said level holding control signal has a second level for activating the data holding circuit to latch the input level of the output buffer at a time immediately before the sense circuit is disabled when the second level of the external memory select instructing signal indicates that the memory device has been deselected.

12. A semiconductor memory device according to claim 2, wherein said sense circuit control means comprises a read/write controller coupled to said sense circuit and to said level holding circuit, wherein said read/write controller further includes means for providing a level holding control signal to said level holding circuit, wherein said level holding control signal has a first level for disabling the level holding circuit when the first level of the external memory select instructing signal indicates that said memory device has been selected, and wherein said level holding control signal has a second level for activating the data holding circuit to latch the input level of the output buffer at a time immediately before the sense circuit is disabled when the second level of the external memory select instructing signal indicates that the memory device has been deselected.

13. A semiconductor memory device according to claim 3, wherein said sense circuit control means comprises a read/write controller coupled to said sense circuit and to said level holding circuit, wherein said read/write controller further includes means for providing a level holding control signal to said level holding circuit, wherein said level holding control signal has a first level for disabling the level holding circuit when the first level of the external memory select instructing signal indicates that said memory device has been selected, and wherein said level holding control signal has a second level for activating the data holding circuit to latch the input level of the output buffer at a time immediately before the sense circuit is disabled when the second level of the external memory select instructing signal indicates that the memory device has been deselected.

14. A chain memory device according to claim 4, wherein said sense circuit control means comprises a read/write controller coupled to said sense circuit and to said level holding circuit, wherein said read/write controller further includes means for providing a level holding control signal to said level holding circuit, wherein said level holding control signal has a first level for disabling the level holding circuit when the first level of the external memory select instructing signal indicates that said memory device has been selected, and wherein said level holding control signal has a second level for activating the data holding circuit to latch the input level of the output buffer at a time immediately before the sense circuit is disabled when the second level of the external memory select instructing signal indicates that the memory device has been deselected.

15. A chain memory device according to claim 5, wherein said sense circuit control means comprises a read/write controller coupled to said sense circuit and to said level holding circuit, wherein said read/write controller further includes means for providing a level holding control signal to said level holding circuit, wherein said level holding control signal has a first level for disabling the level holding circuit when the first level of the external memory select instructing signal indicates that said memory device has been selected, and wherein said level holding control signal has a second level for activating the data holding circuit to latch the input level of the output buffer at a time immediately before the sense circuit is disabled when the second level of the external memory select instructing signal indicates that the memory device has been deselected.

16. A chain memory device according to claim 6, wherein said sense circuit control means comprises a read/write controller coupled to said sense circuit and to said level holding circuit, wherein said read/write controller further includes means for providing a level holding control signal to said level holding circuit, wherein said level holding control signal has a first level for disabling the level holding circuit when the first level of the external memory select instructing signal indicates that said memory device has been selected, and wherein said level holding control signal has a second level for activating the data holding circuit to latch the input level of the output buffer at a time immediately before the sense circuit is disabled when the second level of the external memory select instructing signal indicates that the memory device has been deselected.

17. A data processing apparatus according to claim 7, wherein said sense circuit control means comprises a read/write controller coupled to said sense circuit and to said level holding circuit, wherein said read/write controller further includes means for providing a level holding control signal to said level holding circuit, wherein said level holding control signal has a first level for disabling the level holding circuit when the first level of the external memory select instructing signal indicates that said memory device has been selected, and wherein said level holding control signal has a second level for activating the data holding circuit to latch the input level of the output buffer at a time immediately before the sense circuit is disabled when the second level of the external memory select instructing signal indicates that the memory device has been deselected.

18. A data processing apparatus according to claim 8, wherein said sense circuit control means comprises a read/write controller coupled to said sense circuit and to said level holding circuit, wherein said read/write controller further includes means for providing a level holding control signal to said level holding circuit, wherein said level holding control signal has a first level for disabling the level holding circuit when the first level of the external memory select instructing signal indicates that said memory device has been selected, and wherein said level holding control signal has a second level for activating the data holding circuit to latch the input level of the output buffer at a time immediately before the sense circuit is disabled when the second level of the external memory select instructing signal indicates that the memory device has been deselected.

19. A data reading circuit according to claim 9, wherein further comprising a controller coupled to said sense circuit and said latch, and wherein said controller further includes means for providing a level holding control signal to said latch, wherein said level holding control signal has a first level for disabling the latch when the first level of an external memory select instructing signal indicates that a memory device including said memory cell has been selected, and wherein said level holding control signal has a second level for activating the latch to latch the input level of the output buffer immediately before the sense circuit is disabled when a second level of the memory select instructing signal indicates that the memory device has been deselected.

20. A data reading circuit according to claim 10, wherein further comprising a controller coupled to said sense circuit and said latch, and wherein said controller further includes means for providing a level holding control signal to said latch, wherein said level holding control signal has a first level for disabling the latch when the first level of an external memory select instructing signal indicates that a memory device including said memory cell has been selected, and wherein said level holding control signal has a second level for activating the latch to latch the input level of the output buffer immediately before the sense circuit is disabled when a second level of the memory select instructing signal indicates that the memory device has been deselected.

* * * * *